United States Patent [19]

Ooms et al.

[11] Patent Number: 6,097,047
[45] Date of Patent: *Aug. 1, 2000

[54] FERROELECTRIC SEMICONDUCTOR DEVICE, AND FERROELECTRIC SEMICONDUCTOR SUBSTRATE

[75] Inventors: William J. Ooms, Chandler; Jerald A. Hallmark, Gilbert; Daniel S. Marshall, Chandler, all of Ariz.

[73] Assignee: Motorola, Inc., Schaumburg, Ill.

[*] Notice: This patent is subject to a terminal disclaimer.

[21] Appl. No.: 09/070,063

[22] Filed: Apr. 30, 1998

Related U.S. Application Data

[62] Division of application No. 08/743,769, Nov. 7, 1996, Pat. No. 5,846,847.

[51] Int. Cl.[7] .................................................. H01L 29/78
[52] U.S. Cl. ........................ 257/295; 257/296; 438/3; 438/240
[58] Field of Search ................................. 257/295, 296; 438/3, 240

[56] References Cited

U.S. PATENT DOCUMENTS

| 5,373,176 | 12/1994 | Nakamura | 257/295 |
| 5,466,629 | 11/1995 | Mihara et al. | 437/60 |
| 5,478,653 | 12/1995 | Guenzer | 428/446 |
| 5,524,092 | 6/1996 | Park | 365/145 |
| 5,585,300 | 12/1996 | Summerfelt | 437/60 |
| 5,846,847 | 12/1998 | Ooms et al. | 438/3 |
| 5,851,844 | 12/1998 | Ooms et al. | 438/3 |
| 5,874,755 | 2/1999 | Ooms et al. | 257/295 |

*Primary Examiner*—Leo P. Picard
*Assistant Examiner*—Hung Van Duong
*Attorney, Agent, or Firm*—Lanny L. Parker; William E. Koch

[57] ABSTRACT

A ferroelectric semiconductor device (10) and a method of manufacturing the ferroelectric semiconductor device (10). The ferroelectric semiconductor device (10) is manufactured from a substrate (11) that has a layer (14) of ferroelectric material sandwiched between a substrate (13) and a layer (16) of silicon. A gate structure (24) is formed on the layer (16) of silicon. A source region is formed in a portion of the layer (16) of silicon adjacent one side of the gate structure (24) and a drain region is formed in a portion of the layer (16) of silicon adjacent an opposing side of the gate structure (24).

17 Claims, 1 Drawing Sheet

FERROELECTRIC SEMICONDUCTOR DEVICE, AND FERROELECTRIC SEMICONDUCTOR SUBSTRATE

"The present application is based on prior U.S. application Ser. No. 08/743.769, filed on Nov. 7, 1996, now U.S. Pat. No. 5,846,847 which is hereby incorporated by reference, and priority thereto for common subject matter is hereby claimed."

BACKGROUND OF THE INVENTION

The present invention relates, in general, to semiconductor devices, and more particularly, to ferroelectric semiconductor devices.

Ferroelectric materials have been used to form electrical components such as non-volatile memories, capacitors, and optical guided wave devices. For example, in non-volatile semiconductor devices a ferroelectric material is deposited on a substrate oxide overlying a semiconductor substrate. Then, a gate material is deposited on the ferroelectric material. The gate material and the ferroelectric material are etched to form a gate structure. A drawback in the manufacture of these types of semiconductor devices is that formation of the gate structure causes defects along the edges of the gate structure. These defects degrade the ferroelectric properties of the ferroelectric material.

Accordingly, it would be advantageous to have a ferroelectric device and a method for manufacturing the ferroelectric device that does not damage or degrade the ferroelectric properties of the ferroelectric material.

DETAILED DESCRIPTION OF THE DRAWINGS

Generally, the present invention provides a ferroelectric device and a method for manufacturing the ferroelectric device without degrading the ferroelectric properties of the ferroelectric device. In accordance with one aspect of the present invention, an epitaxial layer of ferroelectric material is formed on a semiconductor material using techniques such as molecular beam epitaxy (MBE), chemical beam epitaxy (CBE), metallo-organic chemical vapor deposition (MOCVD), sputter deposition, or combinations thereof. An advantage of epitaxially forming the interface layer is that the epitaxial layer can be substantially lattice matched to the silicon substrate and thus has a low defect density with substantially no dislocations formed in the crystalline semiconductor structure. It should be noted that the method of forming the ferroelectric material is not a limitation of the present invention.

In another aspect, the present invention provides a method for forming a multi-layer semiconductor substrate, and in yet another aspect, the present invention provides a ferroelectric substrate.

Figure 1:
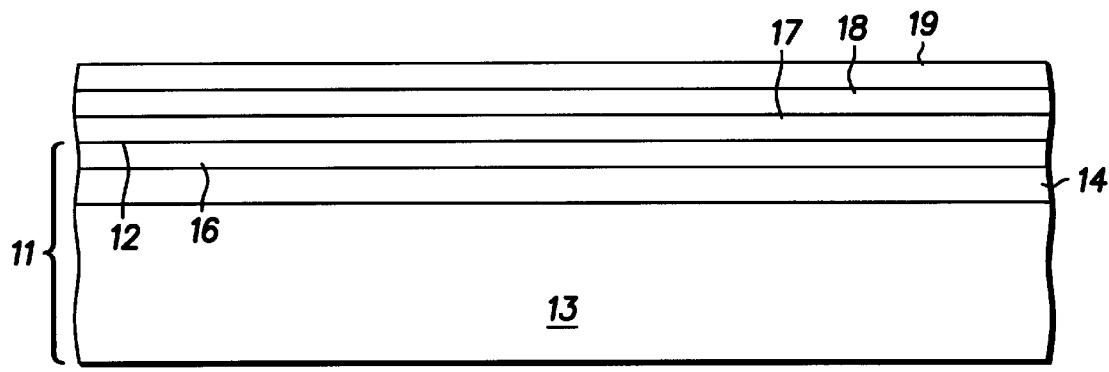
FIG. 1 is a cross-sectional view of a portion of a ferroelectric semiconductor device at an early stage of manufacture in accordance with the present invention.

FIG. 1 is a cross-sectional view of a portion of a ferroelectric semiconductor device 10 at an early stage of manufacture in accordance with the present invention. Ferroelectric semiconductor device 10 includes a silicon-on-ferroelectric substrate 11 having a major surface 12. Preferably, silicon-on-ferroelectric substrate 11 is comprised of a layer 14 of ferroelectric material sandwiched between a single crystalline silicon substrate 13 and a layer 16 of silicon. By way of example, substrate 13 is silicon having a <001> surface orientation and ferroelectric layer 14 is epitaxially formed on semiconductor substrate 13. It should be noted that the material of substrate 13 is not limited to being silicon. Other suitable materials for substrate 13 include indium phosphide, gallium arsenide, or the like. It should be further noted that the substrate may also include regions of a doped material as well. Suitable ferroelectric materials for the ferroelectric layer 14 include barium titanate ($BaTiO_3$) and other perovskites, as well as layered bismuth ferroelectrics such as bismuth titanate ($Bi_4Ti_3O_{12}$) and bismuth strontium tantalate ($SrBi_2Ta_2O_9$), and other ferroelectrics such as yttrium manganate ($YMnO_3$), or the like. Epitaxial films of ferroelectric material may be formed using an ultra high vacuum deposition system such as, for example, molecular beam epitaxy or chemical beam epitaxy, or a low pressure metallo-organic chemical vapor deposition system.

The use of an ultra high vacuum deposition system is a means of preventing undesired elements from destroying the electronic properties at the interface between silicon substrate 13 and ferroelectric layer 14 and between layers 14 and 16. In accordance with one embodiment of the present invention, a monocrystalline layer of ferroelectric material is formed in intimate contact with silicon substrate 13. Further, ferroelectric layer 14 has a lattice constant substantially matching that of silicon substrate 13. Silicon layer 16 is epitaxially grown on ferroelectric layer 14. The method of the present invention prevents undesired material such as, for example, an undesired oxide or contaminants from appearing at the interface between semiconductor substrate 13, ferroelectric layer 14, and silicon layer 16. A surface of silicon layer 16 serves as the major surface 12 of silicon-on-ferroelectric substrate 11.

Still referring to FIG. 1, a layer 17 of dielectric material such as, for example, silicon oxide is formed on silicon layer 16. A layer 18 of conductive material such as for example, polysilicon, is formed on layer 17. A layer 19 of photoresist is formed on layer 18. Techniques for forming layers of dielectric material, conductive material, and photoresist are known to those skilled in the art.

Figure 2:
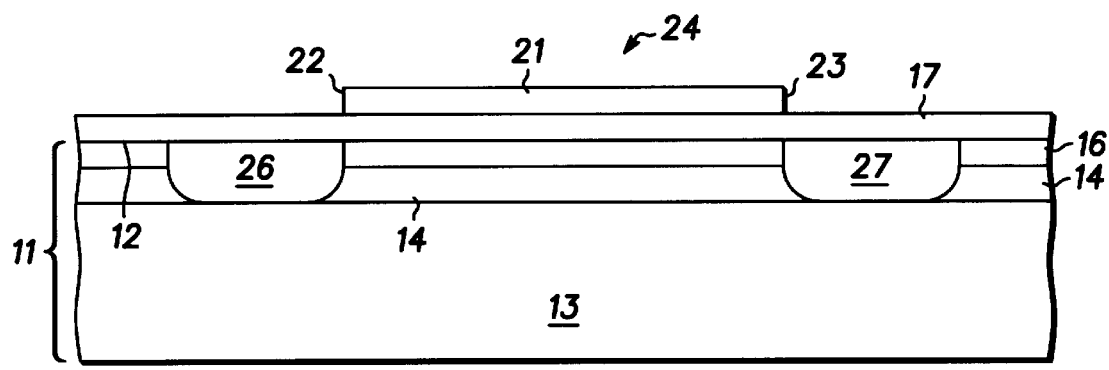
FIG. 2 is a cross-sectional view of the semiconductor device of FIG. 1 further along in processing.

FIG. 2 is a cross-sectional view of ferroelectric semiconductor device 10 further along in processing. It should be noted that the same reference numbers are used in the figures to denote the same elements. Layer 19 (see FIG. 1) is a photoresist layer that is patterned to expose portions layer 18 of conductive material, i.e., patterned photoresist layer 19 of forms an etch mask. A gate electrode 21 having edges 22 and 23 is formed by removing the portions of layer 18 (see FIG. 1) that are unprotected by the etch mask. By way of example, gate electrode 21 is comprised of the portion of layer 18 that remains after a Reactive Ion Etch (RIE) portion of layer 18. The portion of dielectric layer 17 between gate electrode 21 and silicon layer 16 serves as a gate dielectric material which cooperates with gate electrode 21 to form a gate structure 24. The remaining portions of photoresist layer 19 are removed. Although the reactive ion etch is shown in FIG. 2 as terminating at dielectric layer 17, it should be understood this is not a limitation of the present invention. For example, the portion of dielectric layer 17 that unprotected by the etch mask may be removed, thereby exposing portions of major surface 12. A screen oxide layer (not shown) may be formed on the exposed portions of major surface 12.

An impurity material such as, for example, phosphorus is implanted into the portions of silicon layer 16 adjacent edges 22 and 23 of gate structure 24, forming doped regions 26 and 27. Doped regions 26 and 27 serve as source and drain regions, respectively, of ferroelectric semiconductor device 10. Preferably, source and drain regions 26 and 27, respectively, extend through silicon layer 16 and into layer 14. Although source and drain regions 26 and 27, respectively, are shown as being self-aligned to gate structure 24, this is not a limitation of the present invention.

Figure 3:
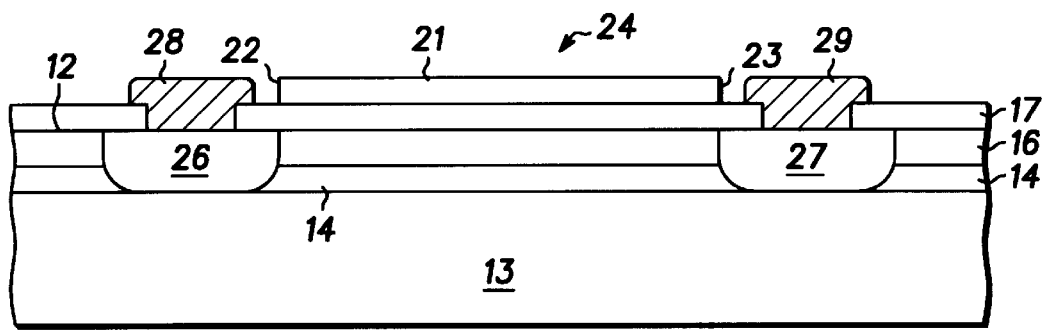
FIG. 3 is a cross-sectional view of the semiconductor device of FIG. 2 further along in processing.

Now referring to FIG. 3, openings (not shown) are formed in portions of dielectric layer 17 to expose portions of major surface 12. Source and drain contacts 28 and 29, respectively, are formed to contact the exposed portions of major surface 12. Formation of source and drain contacts is well known to those skilled in the art.

It should be noted the present invention is suitable for forming N-channel and P-channel enhancement mode field effect transistors and N-channel and P-channel depletion mode field effect transistors. Thus, the source/drain regions can be formed using an impurity material of P conductivity type such as, for example, boron.

In operation, the remnant polarization in the ferroelectric layer 14 is determined by applying a sufficient potential between gate electrode 21 and substrate 13. The remnant polarization induces a threshold shift in silicon layer 16 in the region immediately below gate structure 24.

By now it should be appreciated that a ferroelectric transistor and a method for forming the ferroelectric transistor have been provided. An advantage of the method and structure of the present invention is that the ferroelectric material is protected from damage by, for example, reactive ion etch techniques. Further, the transistors can be manufactured using conventional semiconductor processing techniques.

While specific embodiments of the invention have been shown and described, further modifications and improvements will occur to those skilled in the art. It is understood that this invention is not limited to the particular forms shown and it is intended for the appended claims to cover all modifications of the invention which fall within the true spirit and scope of the invention.

What is claim is:

1. A ferroelectric semiconductor device, comprising:
    a substrate;
    a ferroelectric material over the substrate;
    a semiconductor material of a first conductivity type over the ferroelectric material;
    a gate structure having first and second edges over the semiconductor material;
    a source region adjacent the first edge of the gate structure; and
    a drain region adjacent the second edge of the gate structure.

2. The ferroelectric semiconductor device of claim 1, wherein the ferroelectric material is bismuth titanate.

3. The ferroelectric semiconductor device of claim 1, wherein the substrate is silicon.

4. The ferroelectric semiconductor device of claim 1, wherein the source and drain regions are of a second conductivity type.

5. The ferroelectric semiconductor device of claim 1, wherein the gate structure comprises a layer of dielectric material disposed over the semiconductor material and a layer of conductive material disposed on the layer of dielectric material.

6. The ferroelectric semiconductor device of claim 1, further including first and second contacts to the layer of semiconductor material, the first contact adjacent the first edge of the gate structure and the second contact adjacent the second edge of the gate structure.

7. The ferroelectric semiconductor device of claim 1, wherein the ferroelectric material is an epitaxial layer.

8. The ferroelectric semiconductor device of claim 1, wherein the semiconductor material includes a first doped region in a portion of the layer of semiconductor material adjacent the first edge of the gate structure; and
    a second doped region in a portion of the layer of semiconductor material adjacent the second edge of the gate structure.

9. The ferroelectric semiconductor device of claim 1, wherein the first and second doped regions extend through the layer of semiconductor material.

10. The ferroelectric semiconductor device of claim 1, wherein the gate structure includes:
    a gate dielectric material over the layer of semiconductor material; and
    a gate electrode over the gate dielectric material.

11. A ferroelectric transistor, comprising:
    a substrate;
    a layer of ferroelectric material disposed over the substrate;
    a layer of semiconductor material disposed over the layer of ferroelectric material;
    a layer of dielectric material disposed over the layer of semiconductor material;
    a gate electrode formed over the layer of dielectric material; and
    first and second doped regions formed in a portion of the layer of semiconductor material on opposing sides of the gate electrode.

12. The ferroelectric transistor of claim 11, wherein the layer of semiconductor material is silicon.

13. The ferroelectric transistor of claim 11, wherein the layer of dielectric material is silicon oxide.

14. The ferroelectric transistor of claim 11, wherein the layer of ferroelectric material is an epitaxial layer.

15. A ferroelectric transistor forming a conduction path in a layer above a substrate, comprising:
    a layer of ferroelectric material disposed over the substrate;
    a layer of semiconductor material disposed over the layer of ferroelectric material;
    a gate structure formed over the layer of semiconductor material; and
    first and second doped regions formed on opposing sides of the gate structure and extending through the layer of semiconductor material, wherein the conduction path of the ferroelectric transistor is formed between the first and second doped regions in the semiconductor material.

16. The ferroelectric transistor of claim 15, wherein the layer of ferroelectric material is an epitaxial layer.

17. The ferroelectric transistor of claim 15, wherein the gate structure further comprises:
    a layer of dielectric material disposed over the layer of semiconductor material; and
    a gate electrode formed over the layer of dielectric material.

* * * * *